United States Patent
Kinoshita

(10) Patent No.: US 10,879,386 B2
(45) Date of Patent: Dec. 29, 2020

(54) SEMICONDUCTOR DEVICE AND METHOD OF MANUFACTURING A SEMICONDUCTOR DEVICE

(71) Applicant: FUJI ELECTRIC CO., LTD., Kawasaki (JP)

(72) Inventor: Akimasa Kinoshita, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 21 days.

(21) Appl. No.: 16/168,948

(22) Filed: Oct. 24, 2018

(65) Prior Publication Data

US 2019/0198662 A1 Jun. 27, 2019

(30) Foreign Application Priority Data

Dec. 25, 2017 (JP) .................. 2017-248499

(51) Int. Cl.
| | |
|---|---|
| *H01L 29/06* | (2006.01) |
| *H01L 29/04* | (2006.01) |
| *H01L 29/10* | (2006.01) |
| *H01L 29/66* | (2006.01) |
| *H01L 29/78* | (2006.01) |
| *H01L 23/485* | (2006.01) |
| *H01L 23/532* | (2006.01) |
| *H01L 29/16* | (2006.01) |

(Continued)

(52) U.S. Cl.
CPC ...... *H01L 29/7813* (2013.01); *H01L 29/0623* (2013.01); *H01L 29/0865* (2013.01); *H01L 29/0878* (2013.01); *H01L 29/0882* (2013.01); *H01L 29/1095* (2013.01); *H01L 29/1608* (2013.01); *H01L 29/41741* (2013.01); *H01L 29/4236* (2013.01); *H01L 29/45* (2013.01); *H01L 29/66068* (2013.01)

(58) Field of Classification Search
CPC ............................ H01L 29/45; H01L 29/7802
See application file for complete search history.

(56) References Cited

U.S. PATENT DOCUMENTS

| | | | |
|---|---|---|---|
| 2002/0014696 A1* | 2/2002 | Asahina ................ | H01L 23/485 257/751 |
| 2010/0193799 A1* | 8/2010 | Nakano ............... | H01L 29/4236 257/77 |

(Continued)

FOREIGN PATENT DOCUMENTS

JP 2014-033200 A 2/2014

*Primary Examiner* — Omar F Mojaddedi

(57) ABSTRACT

A semiconductor device includes a semiconductor substrate of a first conductivity type, a first semiconductor layer of the first conductivity type, a second semiconductor layer of a second conductivity type, a first semiconductor region of the first conductivity type, a gate electrode provided via a gate insulating film, an interlayer insulating film, and a barrier metal. At a temperature T (K) and where a guaranteed time of no negative bias temperature instability is L (h), a surface density $t_{Ti1}$ of Ti contained in the barrier metal satisfies:

$$t_{Ti1} > \frac{1}{1.58 \times 10^5} \left\{ \ln\left(\frac{L}{1.74 \times 10^{-8}}\right) + \frac{Ea}{473 \times k} - \frac{Ea}{kT} \right\}$$

where, k is Boltzmann's constant, and Ea is activation energy satisfying 1.0 (eV)<Ea<1.5 (eV).

5 Claims, 8 Drawing Sheets

(51) Int. Cl.
*H01L 29/423* (2006.01)
*H01L 29/417* (2006.01)
*H01L 29/08* (2006.01)
*H01L 29/45* (2006.01)

(56) References Cited

U.S. PATENT DOCUMENTS

| | | | |
|---|---|---|---|
| 2013/0075756 A1* | 3/2013 | Arthur | H01L 29/7802 |
| | | | 257/77 |
| 2014/0034963 A1 | 2/2014 | Michael et al. | |
| 2015/0303205 A1* | 10/2015 | Kaneoka | H01L 29/518 |
| | | | 438/591 |
| 2017/0141186 A1* | 5/2017 | Shiomi | H01L 29/7813 |

* cited by examiner

US 10,879,386 B2

SEMICONDUCTOR DEVICE AND METHOD OF MANUFACTURING A SEMICONDUCTOR DEVICE

CROSS REFERENCE TO RELATED APPLICATIONS

This application is based upon and claims the benefit of priority of the prior Japanese Patent Application No. 2017-248499, filed on Dec. 25, 2017, the entire contents of which are incorporated herein by reference.

BACKGROUND

1. Field

Embodiments of the invention relate to a semiconductor device and a method of manufacturing a semiconductor device.

2. Description of Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs). These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

There is a strong demand in the market for a large-current, high-speed power semiconductor device. Thus, IGBTs and power MOSFETs have been intensively developed and improved, and the performance of power devices has substantially reached the theoretical limit determined by the silicon material. In terms of power semiconductor devices, semiconductor materials to replace silicon have been investigated and silicon carbide (SiC) has been focused on as a semiconductor material enabling production (manufacture) of a next-generation power semiconductor device having low ON voltage, high-speed characteristics, and high-temperature characteristics.

Silicon carbide is chemically a very stable material, has a wide bandgap of 3 eV, and can be used very stably as a semiconductor material even at high temperatures. Further, silicon carbide has a critical electric field strength that is ten times that of silicon or greater; and has a high possibility of exceeding the material limit of silicon. Therefore, future growth is strongly expected for power semiconductor applications, particularly MOSFETs.

As for silicon carbide semiconductor devices, bias temperature instability (BTI) may cause a substantial change in device performance. For example, negative bias temperature instability (NBTI), particularly, during operation for long periods under specific conditions such as reverse bias or high temperature, may cause significant variation or drift of the threshold voltage of a SiC device. NBTI in a SiC device is thought to be a result of an interface charge trapping (for example, oxide film charge). Interface charge trapping, for example, may be induced by operating the device for a long period under specific bias conditions and at high temperature. For example, a silicon carbide MOSFET may be subject to threshold voltage shifts when subjected to an application of composite voltage temperature stress due to NBTI.

Therefore, a commonly known proposed device has as constituent source electrode that is made of metal that controls threshold voltage shifts of the semiconductor device and thereby, reduces bias temperature instability (BTI) (for example, refer to Japanese Laid-Open Patent Publication No. 2014-33200).

FIG. 12 is a cross-sectional view of a structure of a conventional silicon carbide semiconductor device. The conventional silicon carbide semiconductor device depicted in FIG. 12 includes an ordinary MOS gate on front surface (surface on a p-type base layer 106 side) side of a semiconductor base (hereinafter, silicon carbide base) 200 containing silicon carbide. The silicon carbide base (semiconductor chip) 200 is formed by sequentially forming by epitaxial growth on an n$^+$-type starting substrate (hereinafter, n$^+$-type silicon carbide substrate) 101 containing silicon carbide, silicon carbide layers constituting an n$^-$-type drift layer 102 and the p-type base layer 106.

In the p-type base layer 106, an n-type source region 107 and a p$^+$-type contact region 108 are selectively formed. Reference numerals 109, 110, 120, 112 are a gate insulating film, a gate electrode, dielectric layer, and a source electrode, respectively. For example, a metal such as indium (In), Al (aluminum)-Ti (titanium), Al, Au (gold)-Ni (nickel), Ni, Ta (tantalum), or an alloy thereof is used in the source electrode 112, whereby threshold voltage shifts may be controlled.

SUMMARY

According to an embodiment of the present invention, a semiconductor device includes a semiconductor substrate of a first conductivity type; a first semiconductor layer of the first conductivity type provided on a front surface of the semiconductor substrate and having an impurity concentration lower than an impurity concentration of the semiconductor substrate; a second semiconductor layer of a second conductivity type provided on a first side of the first semiconductor layer, opposite a second side of the first semiconductor layer facing toward the semiconductor substrate; a first semiconductor region of the first conductivity type selectively provided in the second semiconductor layer and having an impurity concentration that is higher than the impurity concentration of the semiconductor substrate; a gate electrode provided in at least a part on a surface of the second semiconductor layer, between the first semiconductor region and the first semiconductor layer, via a gate insulating film; an interlayer insulating film provided on the gate electrode; and a barrier metal provided on the interlayer insulating film. At a temperature T (K) and where a guaranteed time of no negative bias temperature instability is L (h), a surface density $t_{Ti1}$ of Ti contained in the barrier metal satisfies;

$$t_{Ti1} > \frac{1}{1.58 \times 10^5}\left\{\ln\left(\frac{L}{1.74 \times 10^{-8}}\right) + \frac{Ea}{473 \times k} - \frac{Ea}{kT}\right\}$$

where, k is Boltzmann's constant, and Ea is activation energy satisfying 1.0 (eV)<Ea<1.5 (eV).

In the embodiment, the barrier metal includes oxygen of at least 1 mol %. At the temperature T (K) and where the guaranteed time of no negative bias temperature instability is L (h), a surface density $t_{Ti2}$ of Ti contained in the barrier metal satisfies:

$$t_{Ti2} > \frac{1}{1.58 \times 10^5}\left\{\ln\left(\frac{L}{2.68 \times 10^{-5}}\right) + \frac{Ea}{473 \times k} - \frac{Ea}{kT}\right\}$$

where, k is Boltzmann's constant, and Ea is activation energy satisfying 1.0 (eV)<Ea<1.5 (eV).

In the embodiment, the barrier metal is provided on a front surface and a side surface of the interlayer insulating film. A surface density $t_{Ti3}$ of Ti at the side surface, satisfies $t_{Ti3} > t_{Ti1}/2$ or $t_{Ti3} > t_{Ti2}/2$.

In the embodiment, the semiconductor device further includes a trench penetrating the first semiconductor region and the second semiconductor layer, and reaching the first semiconductor layer; a second semiconductor region of the second conductivity type selectively provided in the first semiconductor layer; and a third semiconductor region of the second conductivity type selectively provided in the first semiconductor layer and in contact with a bottom the trench. The gate electrode is provided in the trench, via the gate insulating film.

According to an embodiment of the present invention, a method of manufacturing a semiconductor device, includes forming a first semiconductor layer of a first conductivity type on a front surface of a semiconductor substrate of the first conductivity type, the first semiconductor layer having an impurity concentration lower than an impurity concentration of the semiconductor substrate; forming a second semiconductor layer of a second conductivity type on first side of the first semiconductor layer, opposite a second side of the first semiconductor layer facing toward the semiconductor substrate; selectively forming a first semiconductor region of the first conductivity type in the second semiconductor layer, the first semiconductor region having an impurity concentration higher than the impurity concentration of the semiconductor substrate; forming a gate electrode in at least a part on a surface of the second semiconductor layer, between the first semiconductor region and the first semiconductor layer, via a gate insulating film; forming an interlayer insulating film on the gate electrode; and forming a barrier metal on the interlayer insulating film. In forming the barrier metal, at a temperature T (K) and where a guaranteed time of no negative bias temperature instability is L (h), a surface density $t_{Ti1}$ of Ti contained in the barrier metal satisfies:

$$t_{Ti1} > \frac{1}{1.58 \times 10^5}\left\{\ln\left(\frac{L}{1.74 \times 10^{-8}}\right) + \frac{Ea}{473 \times k} - \frac{Ea}{kT}\right\}$$

where, k is Boltzmann's constant, and Ea is activation energy satisfying 1.0 (eV)<Ea<1.5 (eV).

In the embodiment, the method further includes injecting oxygen of at least 1 mol % into the barrier metal after forming the barrier metal. In forming the barrier metal, at the temperature T (K) and where the guaranteed time of no negative bias temperature instability is L (h), a surface density $t_{Ti2}$ of Ti contained in the barrier metal satisfies:

$$t_{Ti2} > \frac{1}{1.58 \times 10^5}\left\{\ln\left(\frac{L}{2.68 \times 10^{-5}}\right) + \frac{Ea}{473 \times k} - \frac{Ea}{kT}\right\}$$

where, k is Boltzmann's constant, and Ea is activation energy satisfying 1.0 (eV)<Ea<1.5 (eV).

Objects, features, and advantages of the present invention are specifically set forth in or will become apparent from the following detailed description of the invention when read in conjunction with the accompanying drawings.

DESCRIPTION OF EMBODIMENTS

Figure 1:
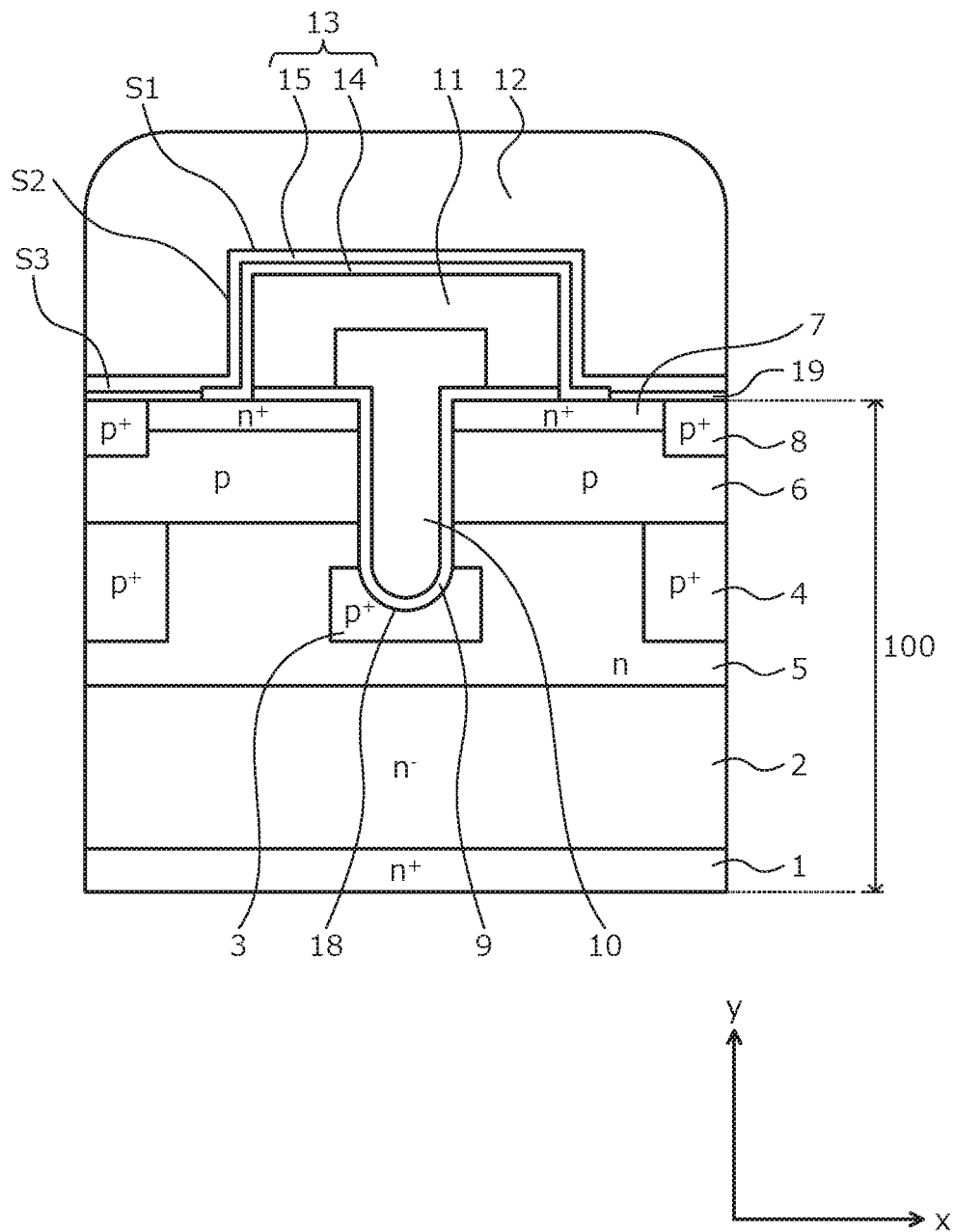
FIG. 1 is a cross-sectional view of a structure of a silicon carbide semiconductor device according to an embodiment.

First, problems associated with the conventional techniques will be discussed. In Japanese Laid-Open Patent Publication No. 2014-33200, evaluation of the threshold voltage (Vth) is performed only at a certain point and therefore, an abnormality at a part of an element cannot be found. For example, when a problem occurs at a part of an element, variation around a threshold value of current lower than the threshold voltage Vth occurs. Further, while Japanese Laid-Open Patent Publication No. 2014-33200 describes suppression of variation of the threshold voltage Vth, variation of the threshold voltage Vth is not eliminated, and variation of the threshold voltage Vth further occurs under a condition where various metals are used in the source electrode. An acceptable variation amount of the threshold voltage Vth differs according to application and therefore; a problem arises in that the conditions in Japanese Laid-Open Patent Publication No. 2014-33200 alone cannot be used for products.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described.

A semiconductor device according to an embodiment of the present invention is configured using a semiconductor material (hereinafter, wide bandgap semiconductor material) having a bandgap wider than that of silicon. Here; a structure of a semiconductor device (silicon carbide semiconductor device) using, for example, silicon carbide (SiC) as the wide bandgap semiconductor material will be described as an example. FIG. 1 is a cross-sectional view of a structure of a silicon carbide semiconductor device according to the embodiment.

In FIG. 1, only one unit cell (functional unit of an element) is depicted and other unit cells adjacent thereto are not depicted. The silicon carbide semiconductor device according to the embodiment depicted in FIG. 1 is a MOSFET that includes a MOS gate at a front surface (surface on a p-type base layer 6 side) of a semiconductor base (silicon carbide base: semiconductor chip) 100 that contains silicon carbide.

The silicon carbide base 100 is formed by sequentially forming by epitaxial growth on an n$^+$-type starting substrate (semiconductor substrate of a first conductivity type) 1 containing silicon carbide, silicon carbide layers constituting an n$^−$-type drift layer (first semiconductor layer of the first conductivity type) 2 and a p-type base layer (second semiconductor layer of a second conductivity type) 6. The MOS gate is constituted by the p-type base layer 6, an n$^+$-type source region (first semiconductor region of the first conductivity type) 7, a p$^+$-type contact region 8, a trench 18, a gate insulating film 9, and a gate electrode 10. In particular, in a surface layer of the n$^−$-type drift layer 2 on a side of the n$^−$-type drift layer 2 facing toward a source (a source electrode 12), an n-type region 5 is provided so as to be in contact with the p-type base layer 6. The n-type region 5 is a so-called current spreading layer (CSL) that reduces carrier spreading resistance. The n-type region 5, for example, is provided uniformly along a direction parallel to a base front surface (a front surface of the silicon carbide base 100).

In the n-type region 5, a first p$^+$-type region (third semiconductor region of the second conductivity type) 3 and a second p$^+$-type region (second semiconductor region of the second conductivity type) 4 are each selectively provided. The first p$^+$-type region 3 is provided so as to be in contact with a bottom of the trench 18 described hereinafter. The first p$^+$-type region 3 is provided at a depth not reaching an interface of the n-type region 5 and the n$^−$-type drift layer 2, from a depth deeper toward a drain than is an interface of the p-type base layer 6 and the n-type region 5. Provision of the first p$^+$-type region 3 enables formation of a pn junction between the first p$^+$-type region 3 and the n-type region 5, near the bottom of the trench 18.

Further, a width of the first p$^+$-type region 3 is equal to or wider than a width of the trench 18. The bottom of the trench 18 may reach the first p$^+$-type region 3 or may be positioned in the n-type region 5, sandwiched between the p-type base layer 6 and the first p$^+$-type region 3. Further, the second p$^+$-type region 4 is selectively provided between (mesa part) the trench 18 and an adjacent trench 18. The first p$^+$-type region 3 and the second p$^+$-type region 4 have impurity concentrations higher than that of the p-type base layer 6.

Provision of the first p$^+$-type region 3 enables a pn junction of the first p$^+$-type region 3 and the n-type region 5 to be formed at a position near the bottom of the trench 18 in a depth direction (negative direction along y axis). The junction of the first p$^+$-type region 3 and the n-type region 5 is formed in this manner, thereby enabling application of high electric field to the gate insulating film 9 at the bottom of the trench 18 to be prevented. Therefore, even when a wide bandgap semiconductor material is used as a semiconductor material, high voltage capability is possible. Further, the first p$^+$-type region 3 whose width is wider than the width of the trench 18 is provided, whereby electric field at a corner part where electric field of the bottom of the trench 18 concentrates may be mitigated, further increasing the high voltage capability.

Further, a part of the first p$^+$-type region 3 may extend toward the trench 18 and thereby, form a structure connected with the second p$^+$-type region 4. The n-type region 5 is disposed in stripes, forming a structure in which some are connected, whereby holes generated at the time of avalanche breakdown at a connecting part of the second p$^+$-type region 4 and the n$^−$-type drift layer 2 are efficiently migrated to the source electrode 12, enabling the load on the gate insulating film 9 to be reduced and reliability to be increased.

Further, in the p-type base layer 6, the n$^+$-type source region 7 and the p$^+$-type contact region 8 are each selectively provided so as to be in contact with each other. A depth of the p$^+$-type contact region 8, for example, may be equal to a depth of the n$^+$-type source region 7 or may be deeper than the depth of the n$^+$-type source region 7.

The trench 18 penetrates the n$^+$-type source region 7 and the p-type base layer 6 from the base front surface and reaches the n-type region 5. In the trench 18, along a side wall of the trench 18, the gate insulating film 9 is provided and on the gate insulating film 9, the gate electrode 10 is provided. An end of the gate electrode 10 toward the source may or may not protrude outwardly from the base front surface. The gate electrode 10 may be electrically connected to a gate pad (not depicted) at a non-depicted part. An interlayer insulating film 11 is provided at the entire base front surface so as to cover the gate electrode 10 embedded in the trench 18.

The source electrode 12 is in contact with the n$^+$-type source region 7 and the p$^+$-type contact region 8 via a contact hole opened in the interlayer insulating film 11 and is electrically insulated from the gate electrode 10 by the interlayer insulating film 11. Between the source electrode 12 and the interlayer insulating film 11, for example, a barrier metal 13 is provided that prevents diffusion of metal atoms from the source electrode 12 toward the gate electrode 10. On the source electrode 12, a source electrode pad (not depicted) is provided. At a rear surface (rear surface of the n$^+$-type silicon carbide substrate 1 constituting an n$^+$-type drain region) of the silicon carbide base 100, a drain electrode (not depicted) is provided.

The barrier metal 13 is constituted by a TiN film 14 and a Ti film 15 provided on the source electrode 12 in an order of the TiN film 14 and the Ti film 15. The TiN film 14 covers the interlayer insulating film 11 and at an opening of the TiN film 14, a nickel silicide film 19 is provided between the Ti film 15 and, the n$^+$-type source region 7 and the p$^+$-type contact region 8. In the embodiment, the surface density $t_{Ti}$ (g/cm$^2$) of Ti contained in the barrier metal 13 satisfies expression (1), where a guaranteed time of no NBTI of the silicon carbide semiconductor device is L (h: hours) and operating temperature is T (K).

$$t_{Ti} > \frac{1}{1.58 \times 10^5} \left\{ \ln\left(\frac{L}{1.74 \times 10^{-8}}\right) + \frac{Ea}{473 \times k} - \frac{Ea}{kT} \right\} \quad (1)$$

Here, ln is a logarithm, k is Boltzmann's constant ($8.62 \times 10^{-5}$ (eV/K)), and Ea is activation energy satisfying 1.0 (eV)<Ea<1.5 (eV). In the embodiment, no NBTI is defined to be variation of the threshold voltage Vth is 0.1V or less.

Further, when the TiN film 14 contains oxygen ($O_2$) of 1 mol % or greater, in the embodiment, the surface density $t_{Ti}$ ($g/cm^2$) of Ti contained in the barrier metal 13 satisfies expression (2), where the guaranteed time of no NBTI of the silicon carbide semiconductor device L is (h) and the operating temperature is T (K)

$$t_{Ti} > \frac{1}{1.58 \times 10^5} \left\{ \ln\left(\frac{L}{2.68 \times 10^{-5}}\right) + \frac{Ea}{473 \times k} - \frac{Ea}{kT} \right\} \quad (2)$$

Here, ln is a logarithm, k is Boltzmann's constant ($8.62 \times 10^{-5}$ (eV/K)), and Ea is activation energy satisfying 1.0 (eV)<Ea<1.5 (eV). Further, the Ti film 15 may contain oxygen, and both the TiN film 14 and the Ti film 15 may contain oxygen.

For example, when the density of Ti of the TiN film 14 and the Ti film 15 is known, the film thicknesses of the TiN film 14 and the Ti film 15 for setting the surface density $t_{Ti}$ of Ti may be calculated. By setting a value at least equal to the calculated film thicknesses of the TiN film 14 and the Ti film 15 of the silicon carbide semiconductor device, the surface density $t_{Ti}$ of Ti or greater may be set.

Further, while the Ti surface density $t_{Ti}$ included in the barrier metal 13 is set to be a value at least equal to the value calculated using expressions (1) or (2) for a surface S1 (surface of the interlayer insulating film 11) parallel to the front surface of the $n^+$-type silicon carbide substrate 1, for a surface S2 (side surface of the interlayer insulating film 11) orthogonal to the front surface of the $n^+$-type silicon carbide substrate 1, the value suffices to be at least ½ of the surface density of Ti. Further, at the barrier metal 13 provided in a contact hole S3, there is no contact with the interlayer insulating film 11 and therefore, the surface density $t_{Ti}$ of Ti may be arbitrary. For the same reason, for the barrier metal 13 provided at a breakdown voltage structure near the element as well, the surface density of Ti may be arbitrary.

In the embodiment, while the barrier metal 13 is constituted by the TiN film 14 and the Ti film 15, another film may be further included. For example, the barrier metal 13 may have an Al—Ti film. When another film is included, the surface density of Ti contained in the barrier metal 13 for all of the layers collectively may satisfy expressions (1) or (2).

Although described in detail hereinafter, by setting the surface density of Ti, even when the silicon carbide semiconductor device is operated in an environment of the temperature T (K), configuration may be such that reliability and performance of the silicon carbide semiconductor device does not degrade during the guaranteed time L (hours) of no NBTI. For example, to guarantee no NBTI when the silicon carbide semiconductor device is operated for 1000 hours in in an environment of a temperature of 200 degrees C. (about 473K), the surface density of Ti has to be at least $1.57 \times 10^{-4}$ $g/cm^2$. Further, without dependency on the breakdown voltage of the silicon carbide semiconductor device, for a breakdown voltage of 1200V or a breakdown voltage of 1700V, the required surface density $t_{Ti}$ of Ti is the same value.

The greater the surface density $t_{Ti}$ of Ti is, the higher is a shielding property by the barrier metal 13 and therefore, the time it takes for NBTI to start increases. However, the greater the surface density $t_{Ti}$ of Ti is, the higher the cost is for production man-hours. From expressions (1) and (2), the required surface density $t_{Ti}$ of Ti is calculated by the guaranteed time of no NBTI and the surface density $t_{Ti}$ of Ti is not increased unnecessarily, enabling material cost and manufacturing time to be reduced, and cost to be reduced. Further, the barrier metal 13 contains oxygen, thereby enabling the shielding property to be further enhanced and the guaranteed time of no NBTI to be realized by a smaller surface density $t_{Ti}$ of Ti.

Figure 2:
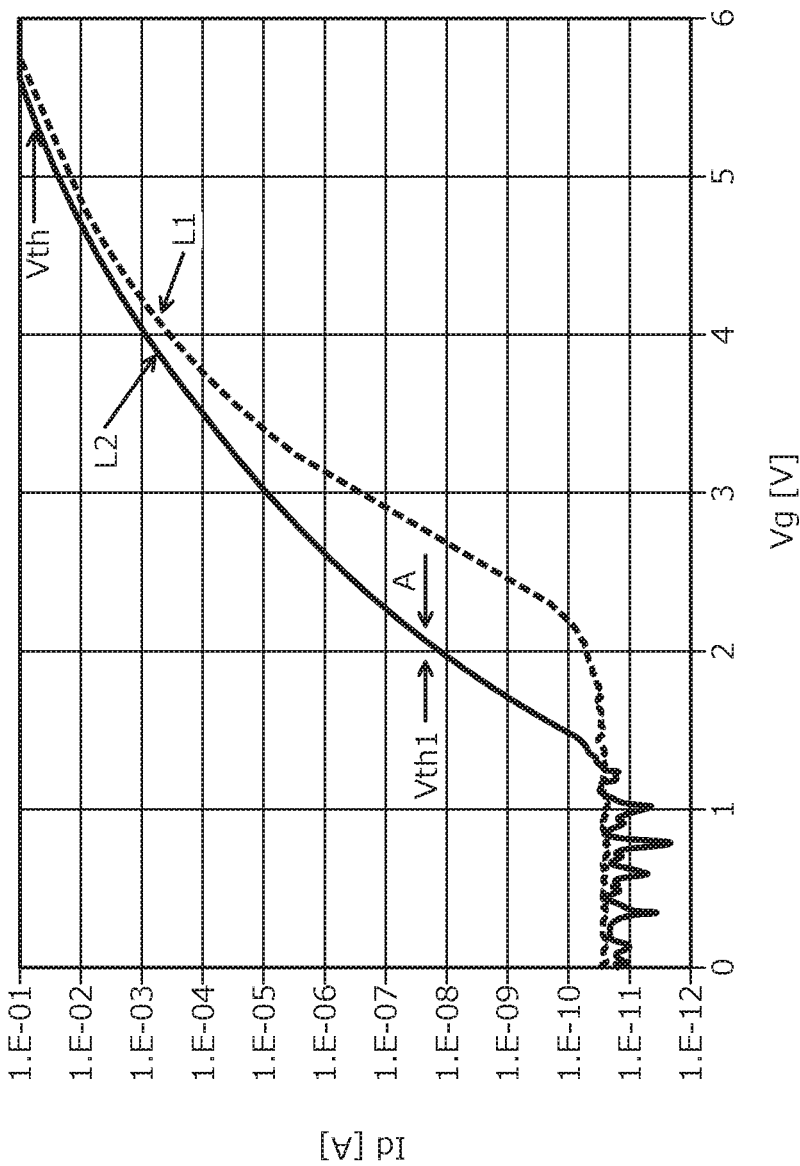
FIG. 2 is a graph depicting drain current with respect to gate voltage of the silicon carbide semiconductor device.

No NBTI during the guaranteed time L (hours) even when the silicon carbide semiconductor device having the surface density of $t_{Ti}$ is operated in an environment of the temperature T (K) will be described. FIG. 2 is a graph depicting drain current with respect to gate voltage of the silicon carbide semiconductor device. In FIG. 2, a vertical axis indicates drain current (Id), in units of A; and a horizontal axis indicates gate voltage (Vg), in units of V. FIG. 2 depicts a Vg-Id curve (L1) of an initial state and a Vg-Id curve (L2) after negative voltage is applied to the gate electrode for a certain period.

As depicted in FIG. 2, at a threshold value (Vth1) where current is lower than the threshold voltage (Vth) due to NBTI, the drain current Id fluctuates toward a low voltage. The time that this fluctuation starts and the temperature at which the silicon carbide semiconductor device is operated were confirmed to have a causal relationship.

Figure 3:
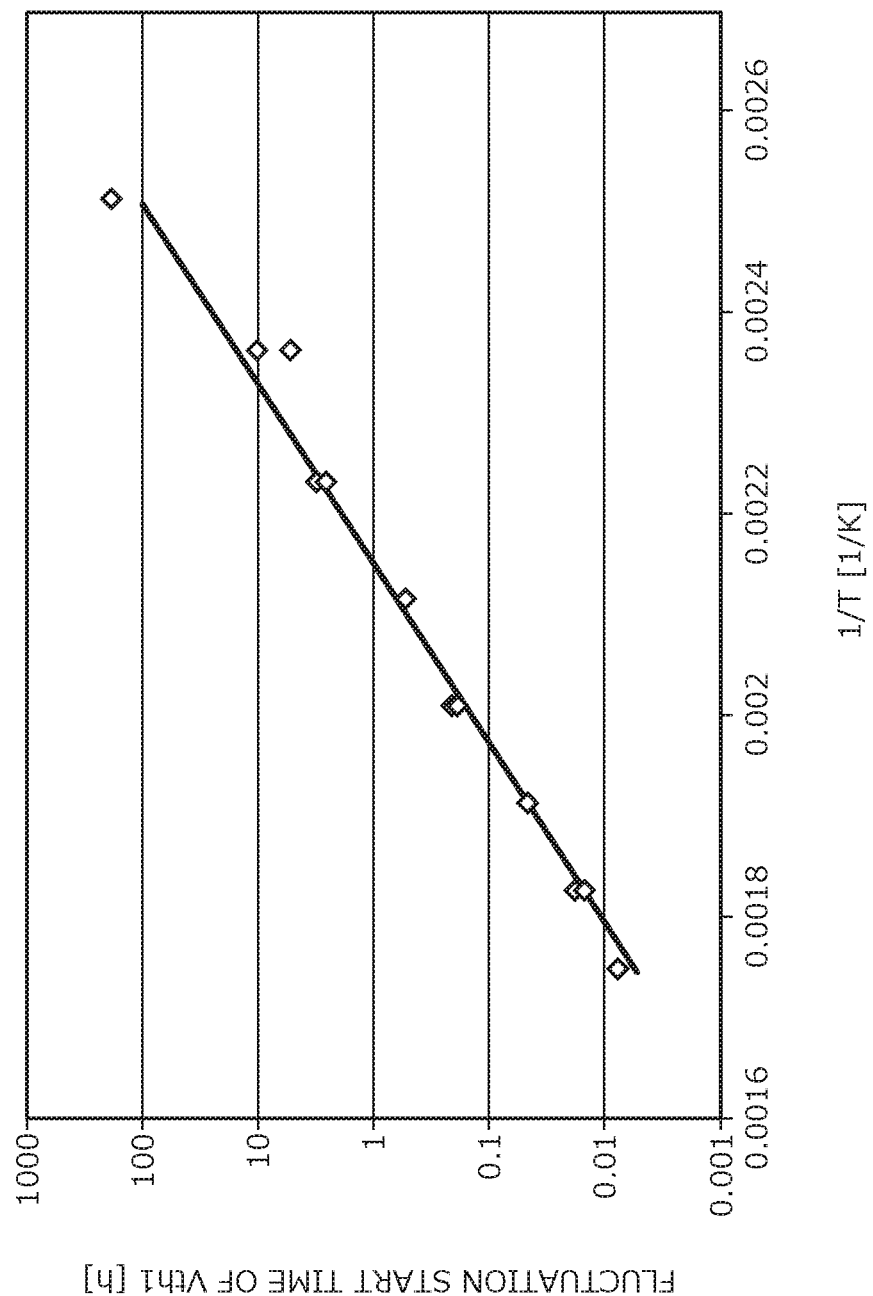
FIG. 3 is a graph depicting a relationship of temperature of the silicon carbide semiconductor device and threshold-value fluctuation start time.

FIG. 3 is a graph depicting a relationship of temperature of the silicon carbide semiconductor device and threshold-value fluctuation start time. In FIG. 3, a vertical axis indicates the fluctuation start time of Vth1, in units of h; and a horizontal axis indicates a reciprocal of temperature, in units of 1/K. In FIG. 3, a 0 point is a result of measurement of the threshold-value fluctuation start time, when the operating temperature of the silicon carbide semiconductor device was varied. As depicted in FIG. 3, as the temperature increases, the fluctuation start time becomes shorter, and when the fluctuation start time of Vth1 is plotted on a logarithmic axis, the threshold-value fluctuation start time and the temperature are plotted on a straight line.

Figure 4:
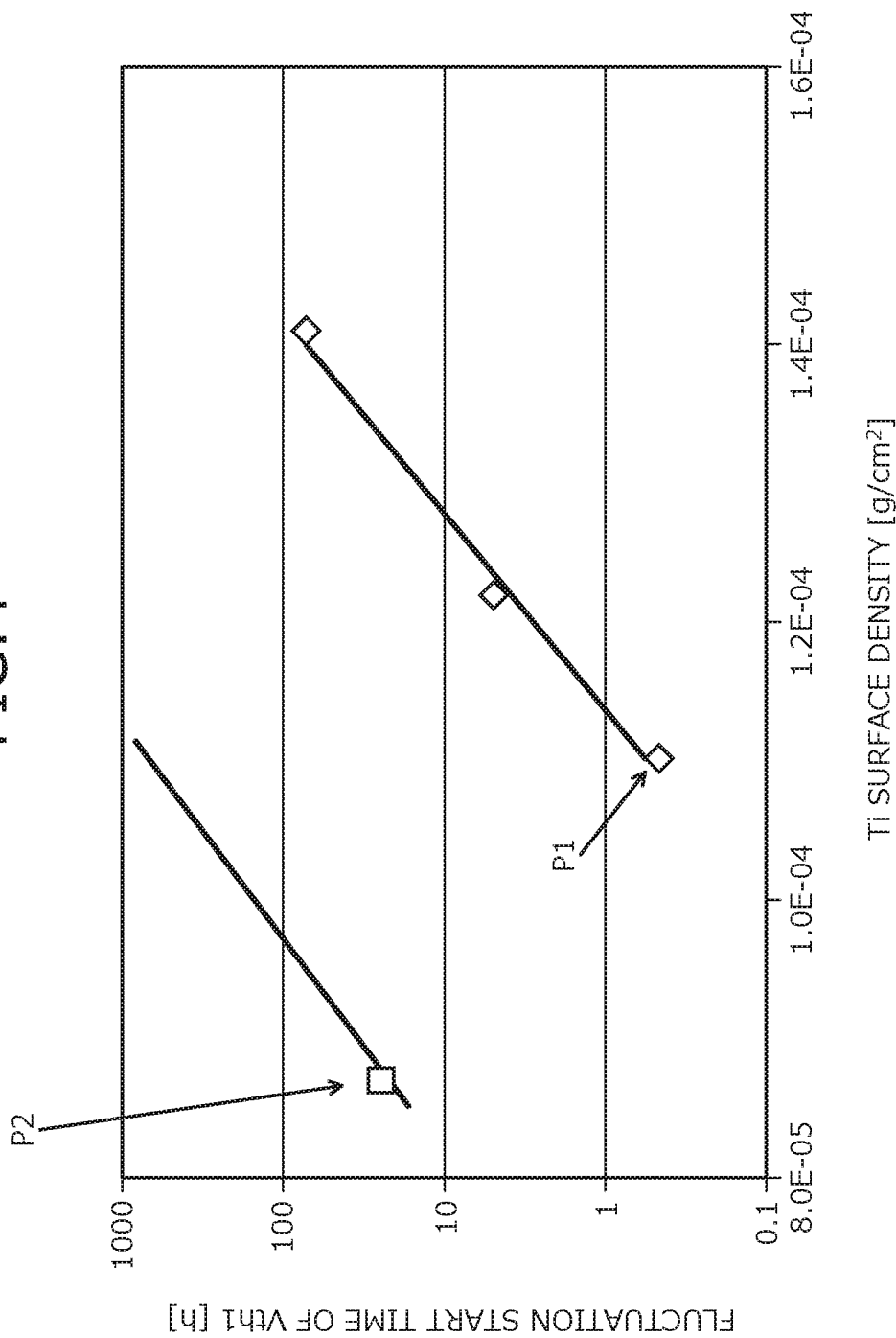
FIG. 4 is a graph depicting a relationship of Ti surface density and threshold-value fluctuation start time of the silicon carbide semiconductor device.

FIG. 4 is a graph depicting a relationship of Ti surface density and threshold-value fluctuation start time of the silicon carbide semiconductor device. In FIG. 4, a vertical axis indicates the fluctuation start time of Vth1, in units of h; and a horizontal axis indicates Ti surface density, in units of $g/cm^2$. FIG. 4 depicts results of measurement of the threshold-value fluctuation start time when the Ti surface density of the barrier metal 13 is varied during operation at 200 degrees C. In FIG. 4, a ◇ point P1 is a measurement result when the barrier metal 13 does not contain oxygen and a □ point P2 is a measurement result when the barrier metal 13 contains oxygen of 1% by weight or more.

As depicted in FIG. 4, the higher the Ti surface density is, the higher is the barrier property, and the slower is the fluctuation start time. Further, when the barrier metal 13 does not contain oxygen and the fluctuation start time of Vth1 is plotted on a logarithmic axis, the threshold-value fluctuation start time and the Ti surface density are plotted on a straight line. Further, similarly in a case where the barrier metal 13 contains oxygen of 1 mol % or more and the fluctuation start time of Vth1 is plotted on a logarithmic axis, the threshold-value fluctuation start time and the Ti surface density are presumed to be plotted on a straight line.

When a relationship of the threshold-value fluctuation start time with respect to the Ti surface density of the silicon carbide semiconductor device and the operating temperature of the silicon carbide semiconductor device are obtained by combining the straight lines of FIGS. 3 and 4, a right term of expressions (1) and (2) results. In this case, Ea of expressions (1) and (2) corresponds to the slope of the straight line of FIG. 4. Therefore, when a Ti surface density greater than the right term of expressions (1) and (2) is used and silicon carbide semiconductor device is operated at the temperature T, no NBTI occurs until the threshold-value fluctuation start time.

Figure 5:
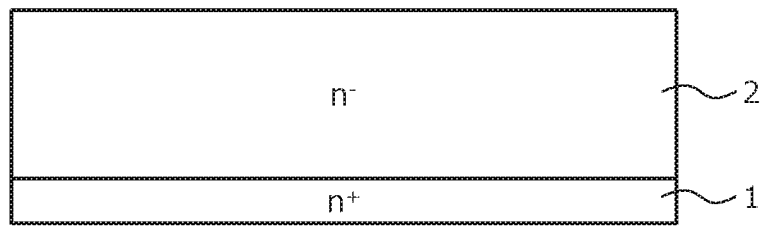
FIG. 5 is a cross-sectional view of the silicon carbide semiconductor device according to the embodiment during manufacture.

A method of manufacturing the semiconductor device according to the embodiment will be described. FIGS. 5, 6, 7, 8, 9, 10, and 11 are cross-sectional views of the silicon carbide semiconductor device according to the embodiment during manufacture. First, the n$^+$-type silicon carbide substrate 1 constituting the n$^+$-type drain region is prepared. Next, on the front surface of the n$^+$-type silicon carbide substrate 1, the n$^-$-type drift layer 2 described above is formed by epitaxial growth. For example, conditions of the epitaxial growth for forming the n$^-$-type drift layer 2 may be set so that an impurity concentration of the n$^-$-type drift layer 2 becomes about $1\times10^{16}$/cm$^3$. The state up to here is depicted in FIG. 5.

Figure 6:
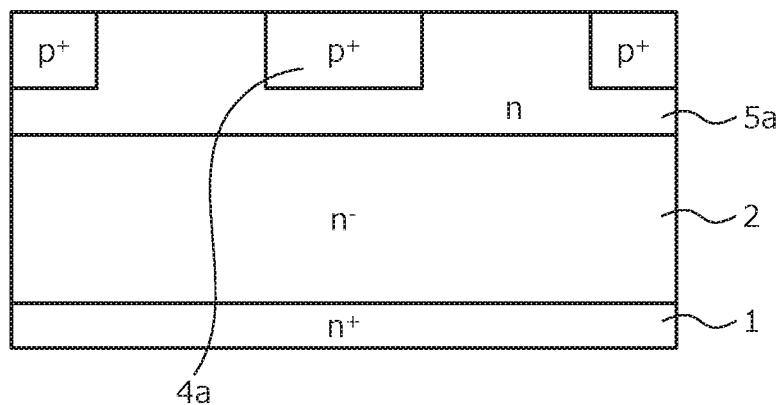
FIG. 6 is a cross-sectional view of the silicon carbide semiconductor device according to the embodiment during manufacture.

Next, on the n$^-$-type drift layer 2, a lower n-type region 5a is formed by epitaxial growth. For example, conditions of the epitaxial growth for forming the lower n-type region 5a may be set so that an impurity concentration of the lower n-type region 5a becomes about $1\times10^{17}$/cm. The lower n-type region 5a is a part of the n-type region 5. Next, by photolithography and ion implantation of a p-type impurity, in a surface layer of the lower n-type region 5a, the lower second p$^+$-type region 4a is selectively formed. The lower second p$^+$-type region 4a is a part of the second p$^+$-type region 4 and the first p$^+$-type region 3. For example, a dose amount of the ion implantation for forming the lower second p$^+$-type region 4a may be set so that an impurity concentration of the lower second p$^+$-type region 4a becomes about $5\times10^{18}$/cm$^3$. The state up to here is depicted in FIG. 6.

Figure 7:
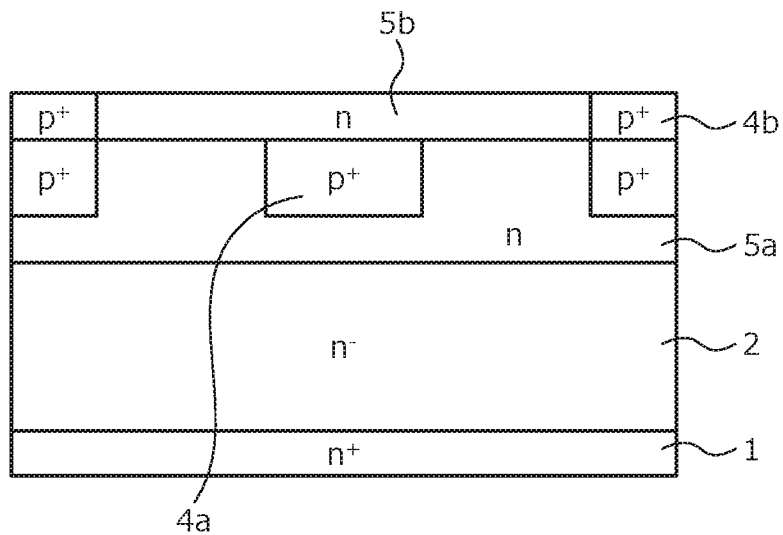
FIG. 7 is a cross-sectional view of the silicon carbide semiconductor device according to the embodiment during manufacture.

Next, on the lower n-type region 5a and the lower second p$^+$-type region 4a, an upper n-type region 5b is formed by epitaxial growth. For example, conditions of the epitaxial growth for forming the upper n-type region 5b may be set so that an impurity concentration of the upper n-type region 5b becomes about equal to that of the lower n-type region 5a. The upper n-type region 5b is a part of the n-type region 5, and the lower n-type region 5a and the upper n-type region 5b combined constitute the n-type region 5. Next, by photolithography and ion implantation of a p-type impurity, in a surface layer of the upper n-type region 5b, an upper second p$^+$-type region 4b is selectively formed. The upper second p$^+$-type region 4b combined with a lower second p$^+$-type region 4a constitutes the second p$^+$-type region 4. A lower second p$^+$-type region 4a not combined with the upper second p$^+$-type region 4b constitutes the first p$^+$-type region 3. For example, a dose amount of the ion implantation for forming the upper second p$^+$-type region 4b may be set so that an impurity concentration of the upper second p$^+$-type region 4b becomes about equal to that of the lower second p$^+$-type region 4a. The state up to here is depicted in FIG. 7.

Figure 8:
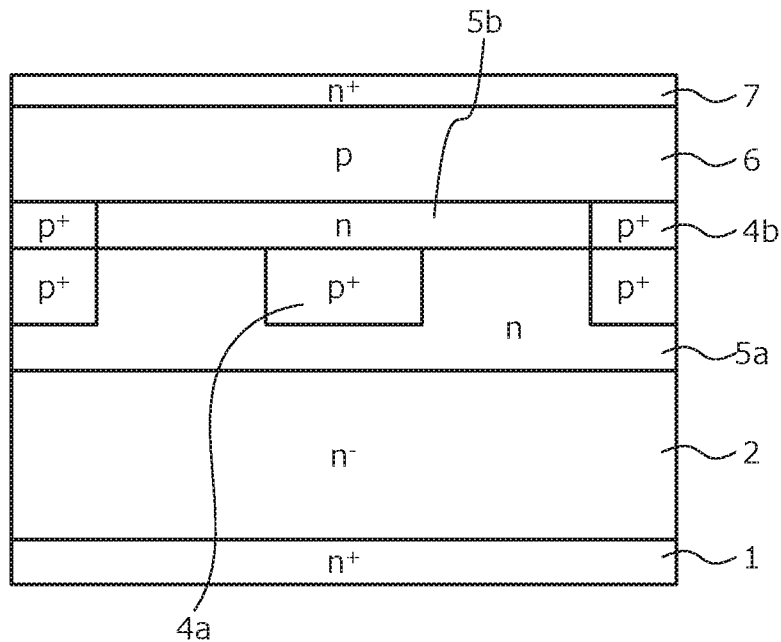
FIG. 8 is a cross-sectional view of the silicon carbide semiconductor device according to the embodiment during manufacture.

Next, on the upper n-type region 5b and the upper second p$^+$-type region 4b, the p-type base layer 6 is formed by epitaxial growth. For example, conditions of the epitaxial growth for forming the p-type base layer 6 may be set so that an impurity concentration of the p-type base layer 6 becomes about $2\times10^{17}$/cm$^3$. Next, by photolithography and ion implantation of an n-type impurity, in a surface layer of the p-type base layer 6, the n$^+$-type source region 7 is selectively formed. For example, a dose amount of the ion implantation for forming the n$^+$-type source region 7 may be set so that an impurity concentration of the n$^+$-type source region 7 becomes about $3\times10^{20}$/cm$^3$. The state up to here is depicted in FIG. 8.

Figure 9:
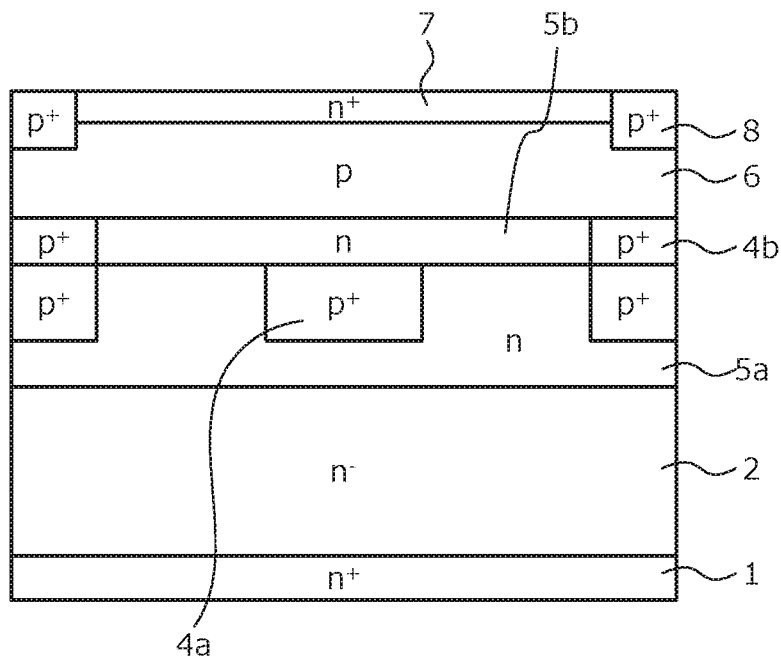
FIG. 9 is a cross-sectional view of the silicon carbide semiconductor device according to the embodiment during manufacture.

Next, by photolithography and ion implantation of a p-type impurity, in the surface layer of the p-type base layer 6, the p$^+$-type contact region 8 is selectively formed so as to be in contact with the n$^+$-type source region 7. For example, a dose amount of the ion implantation for forming the p$^+$-type contact region 8 may be set so that an impurity concentration of the p$^+$-type contact region 8 becomes about $3\times10^{20}$/cm$^3$. An order in which the n$^+$-type source region 7 and the p$^+$-type contact region 8 are formed may be interchanged. After all ion implantations have been completed, activation annealing is performed. The state up to here is depicted in FIG. 9.

Figure 10:
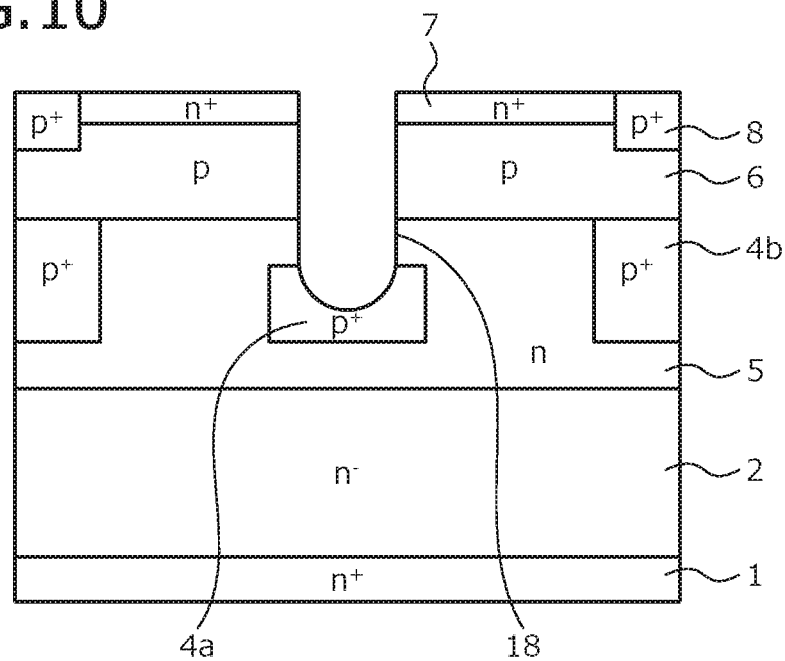
FIG. 10 is a cross-sectional view of the silicon carbide semiconductor device according to the embodiment during manufacture.

Next, by photolithography and etching, the trench 18 is formed to penetrate the n$^+$-type source region 7 and the p-type base layer 6, and reach the n-type region 5. Further, an oxide film is used as a mask at the time of trench formation. Further, after trench etching, isotropic etching for removing damage of the trench 18 and hydrogen annealing for rounding corners of the bottom of the trench 18 and an opening of the trench 18 may be performed. Any one of isotropic etching and hydrogen annealing may be performed. Further, after isotropic etching is performed, hydrogen annealing may be performed. The state up to here is depicted in FIG. 10.

Next, along the front surface of the silicon carbide base 100 and an inner wall of the trench 18, the gate insulating film 9 is formed. Next, so as to be embedded in the trench 18, for example, poly-silicon is deposited and etched, whereby the poly-silicon is left in the trench 18, thereby forming the gate electrode 10. At this time, the poly-silicon may be etched so as to remain below the base surface or patterning and etching may be performed so that the poly-silicon protrudes outward from the base surface.

Next, the interlayer insulating film 11 is formed at the front surface of the silicon carbide base 100 overall so as to cover the gate electrode 10. The interlayer insulating film 11 is formed by, for example, a non-doped silicate glass (NSG), a phosphosilicate glass (PSG), a borophosphosilicate glass (BPSG), a high temperature oxide (HTO), or a combination thereof. Next, the interlayer insulating film 11 and the gate insulating film 9 are patterned, forming a contact hole and exposing the n$^+$-type source region 7 and the p$^+$-type contact region 8.

Figure 11:
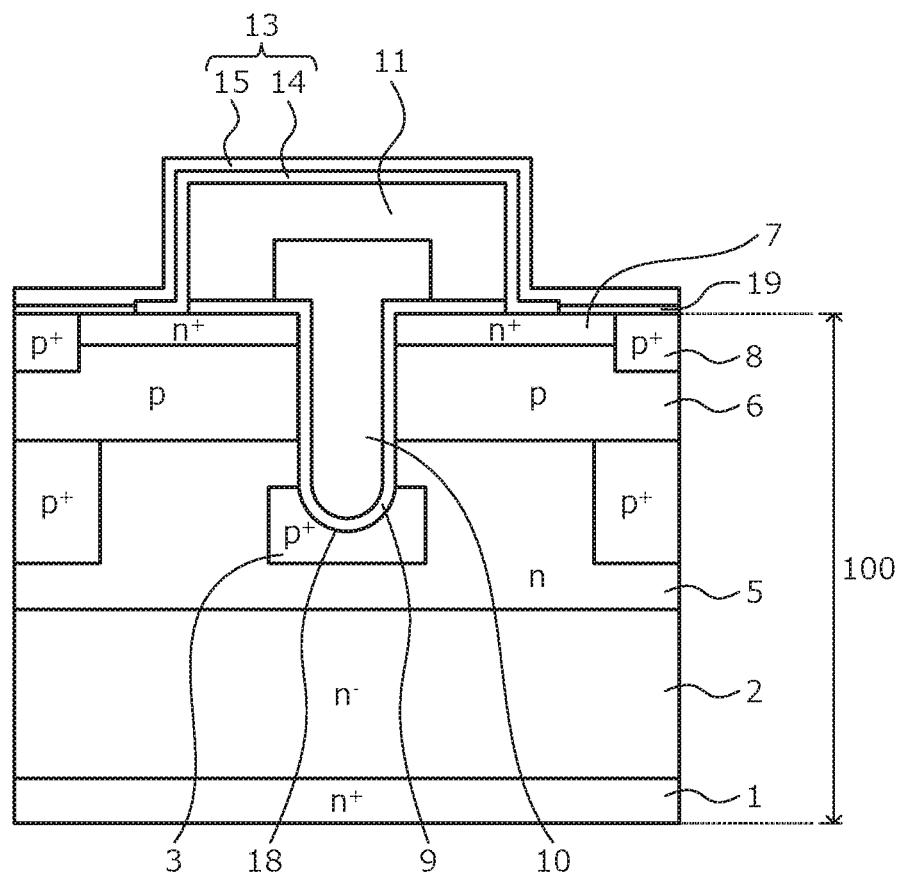
FIG. 11 is a cross-sectional view of the silicon carbide semiconductor device according to the embodiment during manufacture.
Figure 12:
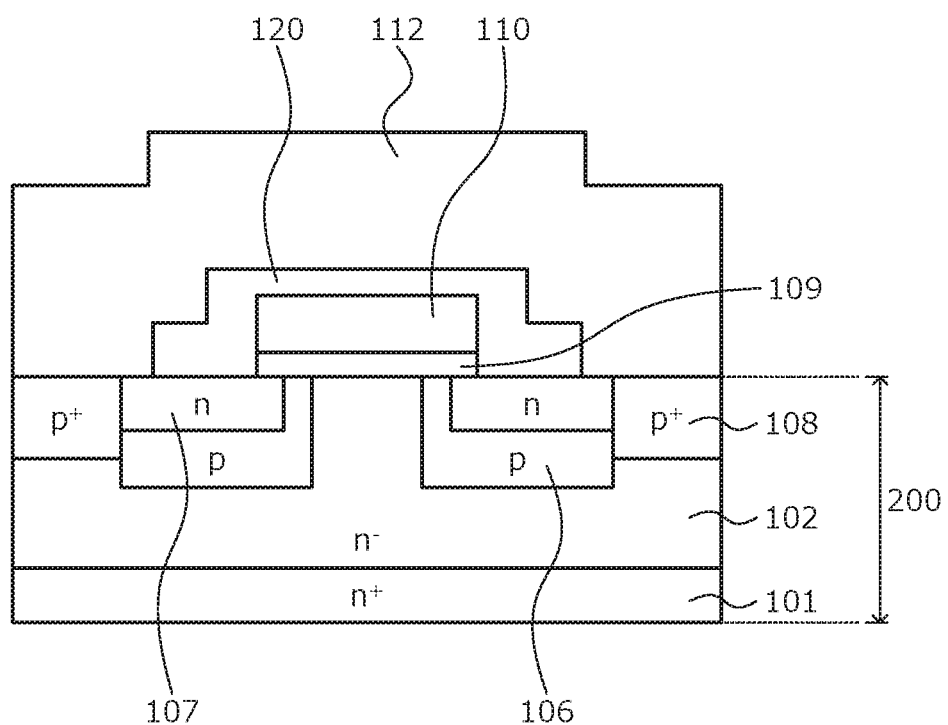
FIG. 12 is a cross-sectional view of a structure of a conventional silicon carbide semiconductor device.

Next, the TiN film 14 is formed so as to cover the interlayer insulating film 11 and patterning is performed, again exposing the n$^+$-type source region 7 and the p$^+$-type contact region 8. Next, on the n$^+$-type source region 7 and the type contact region 8, the nickel silicide film 19 is formed, and the Ti film 15 is formed so as to cover the nickel silicide film 19 and the TiN film 14. The TiN film 14 and the Ti film 15 combined constitute the barrier metal 13. Here, the surface density of Ti contained in the TiN film 14 and the Ti film 15 is set so as to satisfy expression (1). Further, before forming the Ti film 15, the TiN film 14 may be exposed to the atmosphere so as to contain oxygen of 1 mol % or more. In this case, the surface density of Ti contained in the TiN film 14 and the Ti film 15 is set so as to satisfy expression (2). The state up to here is depicted in FIG. 11.

Next, the source electrode 12 is formed so as to be in contact with the n+-type source region 7. The source electrode 12 may be formed so as to cover the barrier metal 13 or may be left only in the contact hole.

Next, the source electrode pad is formed so as to be embedded in the contact hole. A part of a metal layer deposited for forming the source electrode pad may be used as the gate pad. At the rear surface of the n+-type silicon carbide substrate 1, a metal film such as a nickel (Ni) film, a titanium (Ti) film, etc. is formed at a contact part of the drain electrode by sputtering deposition, or the like. The metal film may be a stacked combination of a Ni film and a Ti film. Subsequently, annealing such as rapid thermal annealing (RTA) is performed so as to convert the metal film into a silicide and form an ohmic contact. Thereafter, for example, a thick film such as a stacked film of a Ti film, a Ni film, and a gold (Au) that are sequentially stacked is formed by electron beam (EB) deposition, etc., whereby the drain electrode is formed.

In the epitaxial growth and the ion implantation described, for example, nitrogen (N), phosphorus (P), arsenic (As), antimony (Sb), etc. that are an n-type with respect to silicon carbide, may be used as an n-type impurity (n-type dopant). As a p-type impurity (p-type dopant), for example, boron (B), aluminum (Al), gallium (Ga), indium (In), thallium (Tl), etc. that are a p-type with respect to silicon carbide may be used. In this manner, the MOSFET depicted in FIG. 1 is completed.

As described, according to the embodiment, the surface density of Ti contained in the TiN film and the Ti film is at least a value calculated from the temperature and a threshold-value fluctuation guaranteed time. As a result, the silicon carbide semiconductor device may be resistant to negative bias temperature instability until the threshold-value fluctuation guaranteed time, enabling a highly reliable element to be manufactured. Further, the film thickness of the barrier metal may be calculated from the Ti surface density in advance, thereby enabling reduction of the material costs and manufacturing time, and reduction of the manufacturing cost of the silicon carbide semiconductor device.

In the embodiments of the present invention, various modifications within a range not departing from the spirit of the invention are possible. For example, dimensions, impurity concentrations, etc. of regions may be variously set according to required specifications. Further, in the embodiments above, while a silicon carbide semiconductor device of a trench type has been described as an example, application is further possible to a silicon carbide semiconductor device of a planar type and similar effects are obtained. Further, in the embodiments above, while a case in which silicon carbide is used as a wide bandgap semiconductor material, application is possible to a wide bandgap semiconductor material other than silicon carbide such as, for example, gallium nitride (GaN). Ea of expressions (1) and (2) is a value for silicon carbide. For other wide bandgap semiconductor materials, the value of Ea differs. Further, in the embodiments, while the first conductivity type is assumed as an n-type and the second conductivity type is assumed as a p-type, the present invention is similarly implemented when the first conductivity type is a p-type and the second conductivity type is an n-type.

As described, the surface density of Ti contained in the TiN film and the Ti film is at least a value calculated from the temperature and the threshold-value fluctuation guaranteed time. Therefore, the silicon carbide semiconductor device may be resistant to negative bias temperature instability until the threshold-value fluctuation guaranteed time, enabling a highly reliable element to be manufactured. Further, the film thickness of the barrier metal may be calculated from the surface density of Ti in advance, thereby enabling the material costs and manufacturing time to be reduced, and the manufacturing cost of the silicon carbide semiconductor device to be reduced.

The semiconductor device and the method of manufacturing a semiconductor device of the embodiments of the present invention achieve an effect in that negative bias temperature instability does not occur during a guaranteed time required for a product.

As described, the semiconductor device and the method of manufacturing a semiconductor device of the present invention is useful for a high voltage semiconductor device used in power converting equipment and in power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
a semiconductor substrate of a first conductivity type;
a first semiconductor layer of the first conductivity type provided on a front surface of the semiconductor substrate and having an impurity concentration lower than an impurity concentration of the semiconductor substrate;
a second semiconductor layer of a second conductivity type provided on a first side of the first semiconductor layer, opposite a second side of the first semiconductor layer facing toward the semiconductor substrate;
a first semiconductor region of the first conductivity type selectively provided in the second semiconductor layer and having an impurity concentration that is higher than the impurity concentration of the semiconductor substrate;
a trench penetrating the first semiconductor region and the second semiconductor layer, and reaching the first semiconductor layer;
a second semiconductor region of the second conductivity type selectively provided in the first semiconductor layer;
a third semiconductor region of the second conductivity type selectively provided in the first semiconductor layer and in contact with a bottom the trench;
a gate electrode provided in the trench in at least a part on a surface of the second semiconductor layer, between the first semiconductor region and the first semiconductor layer, via a gate insulating film;
an interlayer insulating film provided on the gate electrode; and
a barrier metal provided on the interlayer insulating film, wherein
at a temperature T (K) and where a guaranteed time of no negative bias temperature instability is L (h), a surface density $t_m$ of Ti contained in the barrier metal satisfies:

$$t_{Ti1} > \frac{1}{1.58 \times 10^5} \left\{ \ln\left(\frac{L}{1.74 \times 10^{-8}}\right) + \frac{Ea}{473 \times k} - \frac{Ea}{kT} \right\}$$

where, k is Boltzmann's constant, and Ea is activation energy satisfying 1.0 (eV)<Ea<1.5 (eV).

2. The semiconductor device according to claim 1, wherein
the barrier metal includes oxygen of at least 1 mol %, and at the temperature T (K) and where the guaranteed time of no negative bias temperature instability is L (h), a surface density$_{Ti2}$ of Ti contained in the barrier metal satisfies:

$$t_{Ti2} > \frac{1}{1.58 \times 10^5} \left\{ \ln\left(\frac{L}{2.68 \times 10^{-5}}\right) + \frac{Ea}{473 \times k} - \frac{Ea}{kT} \right\}$$

where, k is Boltzmann's constant, and Ea is activation energy satisfying 1.0 (eV)<Ea<1.5 (eV).

3. The semiconductor device according to claim 1, wherein
the barrier metal is provided on a front surface and a side surface of the interlayer insulating film, and
a surface density $t_{Ti3}$ of Ti at the side surface, satisfies $t_{Ti3} > t_{Ti1}/2$ or $t_{Ti3} > t_{Ti2}/2$.

4. A semiconductor device comprising:
a semiconductor substrate of a first conductivity type;
a first semiconductor layer of the first conductivity type provided on a front surface of the semiconductor substrate and having an impurity concentration lower than an impurity concentration of the semiconductor substrate;
a second semiconductor layer of a second conductivity type provided on a first side of the first semiconductor layer, opposite a second side of the first semiconductor layer facing toward the semiconductor substrate;
a first semiconductor region of the first conductivity type selectively provided in the second semiconductor layer and having an impurity concentration that is higher than the impurity concentration of the semiconductor substrate;
a trench penetrating the first semiconductor region and the second semiconductor layer, and reaching the first semiconductor layer;
a second semiconductor region of the second conductivity type selectively provided in the first semiconductor layer;
a third semiconductor region of the second conductivity type selectively provided in the first semiconductor layer and in contact with a bottom the trench;
a gate electrode provided in the trench in at least a part on a surface of the second semiconductor layer, between the first semiconductor region and the first semiconductor layer, via a gate insulating film;

an interlayer insulating film provided on the gate electrode; and
a barrier metal provided on the interlayer insulating film, the barrier metal having two different barrier metal layers, each of which includes Ti, wherein
at a temperature T (K) and where a guaranteed time of no negative bias temperature instability is L (h), a surface density ti$_{Ti1}$ of Ti contained in the barrier metal satisfies:

$$t_{Ti1} > \frac{1}{1.58 \times 10^5} \left\{ \ln\left(\frac{L}{1.74 \times 10^{-8}}\right) + \frac{Ea}{473 \times k} - \frac{Ea}{kT} \right\}$$

where, k is Boltzmann's constant, and Ea is activation energy satisfying 1.0 (eV)<Ea<1.5 (eV).

5. A semiconductor device comprising:
a semiconductor substrate of a first conductivity type;
a first semiconductor layer of the first conductivity type provided on a front surface of the semiconductor substrate and having an impurity concentration lower than an impurity concentration of the semiconductor substrate;
a second semiconductor layer of a second conductivity type provided on a first side of the first semiconductor layer, opposite a second side of the first semiconductor layer facing toward the semiconductor substrate;
a first semiconductor region of the first conductivity type selectively provided in the second semiconductor layer and having an impurity concentration that is higher than the impurity concentration of the semiconductor substrate;
a trench penetrating the first semiconductor region and the second semiconductor layer, and reaching the first semiconductor layer;
a second semiconductor region of the second conductivity type selectively provided in the first semiconductor layer;
a third semiconductor region of the second conductivity type selectively provided in the first semiconductor layer and in contact with a bottom the trench;
a gate electrode provided in the trench in at least a part on a surface of the second semiconductor layer, between the first semiconductor region and the first semiconductor layer, via a gate insulating film;
an interlayer insulating film provided on the gate electrode; and
a barrier metal provided on the interlayer insulating film, the barrier metal including Ti having a surface density of $1.57 \times 10^{-4}$ g/cm$^2$.

* * * * *

UNITED STATES PATENT AND TRADEMARK OFFICE
CERTIFICATE OF CORRECTION

PATENT NO. : 10,879,386 B2
APPLICATION NO. : 16/168948
DATED : December 29, 2020
INVENTOR(S) : Akimasa Kinoshita Page 1 of 1

It is certified that error appears in the above-identified patent and that said Letters Patent is hereby corrected as shown below:

In the Claims

Column 12, Line 50:
In Claim 1, after "bottom" insert -- of --.

Column 12, Line 61:
In Claim 1, delete "$t_m$" and insert -- $t_{Ti1}$ --, therefor.

Column 13, Line 8:
In Claim 2, delete "density$_{Ti2}$" and insert -- density $t_{Ti2}$ --, therefor.

Column 13, Line 22:
In Claim 3, delete "t $_{Ti3}$" and insert -- $t_{Ti3}$ --, therefor.

Column 13, Line 23:
In Claim 3, delete "$_{ti2}$/2." and insert -- $t_{Ti2}/2$. --, therefor.

Column 13, Line 48:
In Claim 4, after "bottom" insert -- of --.

Column 14, Line 8:
In Claim 4, delete "ti$_{Ti1}$" and insert -- $t_{Ti1}$ --, therefor.

Column 14, Line 42 (approx.):
In Claim 5, after "bottom" insert -- of --.

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*